United States Patent [19]

Gopalakrishnan et al.

[11] Patent Number: 4,835,136
[45] Date of Patent: May 30, 1989

[54] LANTHANUM: SODIUM COPPER SUPERCONDUCTING METAL OXIDE COMPOSITIONS AND PROCESS FOR MANUFACTURE

[75] Inventors: Jagannatha Gopalakrishnan, Wilmington, Del.; Arthur W. Sleight, Kennett Square, Pa.; Munirpallam A. Subramanian, New Castle, Del.

[73] Assignee: E. I. Du Pont de Nemours and Company, Wilmington, Del.

[21] Appl. No.: 152,185

[22] Filed: Feb. 4, 1988

[51] Int. Cl.$^4$ .................... C01D 1/02; C01F 17/00; C01G 3/02; H01L 39/12

[52] U.S. Cl. .................................. 505/1; 252/518; 252/521; 423/263; 423/593; 423/604; 423/641; 501/152; 505/809; 505/810; 505/815

[58] Field of Search ............... 252/518, 521; 423/263, 423/593, 604, 641; 501/152; 505/1, 809, 810, 815

[56]  References Cited

PUBLICATIONS

Sleight, A. W.: "High Temperature Superconductivity in Oxides", *Chemistry of High-Temperature Superconductors, ACS Symposium Series* 351, Aug. 30–Sep. 4, 1987.

Fartash, A. et al.: "Superconductivity in Yi-4, Nay, Ba$_2$Cu$_3$O$_x$", *Solid State Comm.*, v. 68, No. 1, pp. 39–41, Jan. 1988.

Bednorz and Muller, Z. Phys. B64, 189.

Ogita et al., Japn. K. Appl. Phys. 25, L415 (1987).

Fine et al., "Chemistry of High-Temperature Superconductors", ACS Symposium Series 351, Edited by D. L. Nelson, M. S. Whittingham and T. F. George, American Chemical Society, Wash., D.C. (1987) Chapter 10.

Fine et al., *Phys. Rev. B* 36, 5716 (1987).

*Primary Examiner*—Dennis Albrecht

[57] ABSTRACT

Compositions containing a phase having the formula $LA_{2-x}Na_xCuO_z$ wherein x is about 0.1 to about 0.3 and z is about 3.8 to about 4.2 are superconducting. Processes for manufacturing such compositions and for using them are disclosed.

6 Claims, No Drawings

LANTHANUM: SODIUM COPPER SUPERCONDUCTING METAL OXIDE COMPOSITIONS AND PROCESS FOR MANUFACTURE

BACKGROUND OF THE INVENTION

1. Field of the Invention

This invention relates to novel sodium-containing lanthanum, copper oxide compositions which are superconducting and to a process for making them.

2. References

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Over 400 scientific papers have appeared covering various aspects of these materials. Only three papers discuss attempts to incorporate an alkali metal into the structure and all three have used potassium. Ogita et al., Japn. J. Appl. Phys. 26, L415 (1987) disclose the preparation of $(La_{0.95}K_{0.05})_2CuO_{4-y}$ by mixing prescribed amounts of $La_2O_3$, CuO and $K_2CO_3$, preheating the mixture at 700° C. in air for 12 hours and sintering at 1000° C. in air for 2 hours. The $(La_{0.95}K_{0.05})_2CuO_{4-y}$ product was found to be of the orthorhombic $K_2NiF_4$ type structure and was a semiconductor and not a superconductor down to liquid helium temperature.

Fine et al., "Chemistry of High-Temperature Superconductors", ACS Symposium Series 351, Edited by D. L. Nelson, M. S. Whittingham and T. F. George, American Chemical Society, Wash., D.C. (1987), Chapter 10, discuss the results of a study on the effect of nominal composition on superconductivity in $La_2CuO_{4-y}$. They mixed the oxides of $La_2O_3$ and CuO in appropriate amounts to form samples of the with nominal stoichiometries $La_2CuO_{4-y}$ and $La_{1.9}CuO_{4-y}$ respectively. Each mixture of starting materials was divided into three portions and 5% $K_2CO_3$ and 10% $K_2CO_3$ were added to the second and third portions of each mixture. A sample of nominal composition $La_{1.9}K_{0.1}CuO_7$ was also prepared from appropriate amounts of $La_3O_3$, CuO, and $K_2CO_3$. The x-ray powder diffraction data indicated that all compositions were single phase or nearly single phase and the authors suggested that either the $K_2O$ sublimed out of the sample or was present in a poorly crystalline form. The lattic parameters calculated for all seven samples were the same within two standard deviations and were consistent with the published values for the lattice parameters for $La_2CuO_{4=y}$. The authors state that the implications are "that in all cases the bulk of the sample is stoichiometric, $La_2CuO_{4-y}$, and that a solid solution of then type $La_{2-x}K_xCuO_{4-y}$ did not form".

Fine et al., Phys. Rev. B 36, 5716 (1987), report on the same study discussed in their ACS Symposium Series 351 chapter along with data on an eighth sample of nominal composition $La_{1.8}CuO_{4-y}$ and state the same conclusions.

There is no disclosure that substitution of any alkali metal into $La_2CuO_4$ will result in a single phase composition exhibiting superconductivity above liquid helium temperatures and no disclosure of a composition of the formula $La_{2-x}A_xCuO_{4-y}$ where A is an alkali metal other than potassium.

SUMMARY OF THE INVENTION

This invention provides novel superconducting compositions having a phase with the formula $La_{2-x}Na_xCuO_z$ where x is from about 0.1 to about 0.3 and z is from about 3.8 to about 4.2; said composition having a superconducting transition temperature above 10 K.

This invention also provides a process for making these compositions, said process consisting essentially of heating a mixture of stoichiometric quantities of $La_2O_3$, $Na_2O_2$ and CuO in a sealed metal container at about 850° C. to about 900° C. for about 12 to about 24 hours. Preferred is the process in which the sealed metal container is subjected to external pressure, typically of the order of 3 kbar (100 MPa) since it results in compositions having superconducting transition temperatures of 20 K. or higher.

DETAILED DESCRIPTION OF THE INVENTION

The superconducting phase of the composition of this invention has the nominal formula $Lahd 2-xNa_xCuO_z$, wherein x is from about 0.1 to about 0.3, and wherein the phase has the tetragonal $K_2NiF_4$-type structure with the I4/mmm space group as determined by X-ray powder diffraction measurements.

The superconducting composition of the invention can be prepared by the following process: Stoichiometric quantities of $La_2O_3$, $Na_2O_2$ and CuO are mixed, for example, by grinding them together in a mortar and heating them in a controlled atmosphere. It has been found that the composition of this invention is produced only when the atmosphere in which the reactants are heated is carefully controlled. One way to accomplish this controlled atmosphere is to place the reactants in a tube made of a non-reacting metal such as gold and then sealing the tube by welding. The sealed tube is then placed in a furnace and heated at about 850° C. to about 900° C. for about 12 to 24 hours. The power to the furnace is then turned off and the tube is furnace-cooled to 100° C. and then removed from the furnace and quenched to ambient temperature. The tube is then opened and the black powder product recovered. Compositions prepared in this manner have superconducting transition temperatures from about 10 K. to about 15 K.

Preferred is the process in which the sealed container is subjected to external pressure, typically of the order of 3 kbar (100 MPa) before the heating commences and during the heating step. The compositions prepared in this manner have superconducting transition temperatures exceeding 15 K., typically in the range of about 20 K. to about 30 K.

When the relative amounts of reactants are chosen consistent with the formula $La_{2-x}Na_xCuO_z$, wherein x is from about 0.1 to about 0.3 and z is from about 3.8 to about 4.2, the product of the process of the invention is a single phase and is the composition of the invention. When the relative amounts of reactants are chosen such that x appreciably exceeds 0.3, e.g., such that x=0.4, the product is not a single phase but is a mixture comprised of the composition of the invention and other phases.

Superconductivity can be confirmed by observing magnetic flux exclusion, i.e., the Meissner effect. This effect can be measured by the method described in an article by E. Polturak and B. Fisher in Physical Review B, 36, 5586 (1987).

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature, e.g., at or below about 30 K., preferably at or below about 10 K., by exposing the material to liquid helium in a manner well known to those in this field; and initiating a flow of electrical current, one can obtain such flow without any electrical resistive losses. To provide exceptionally high magnetic fields with minimal power losses, the wire mentioned previously could be wound to form a coil which would be exposed to liquid helium before inducing any current into the coil.

EXAMPLES OF THE INVENTION

Example 1

2.9323 g of $La_2O_3$, 0.0780 g of $Na_2O_2$ and 0.7955 g CuO were ground together in an agate mortar for 30 min. inside a dry box. The resulting powder was loaded in a gold tube ($\frac{3}{8}''$ dia and 5" length) and the tube was sealed by welding it. The tube was then heated to 850° C. for 12 hours in a furnace. The tube was cooled to 100° C. in the furnace, then removed from the furnace and quenched to room temperature. The tube was cut open and the black powder product was recovered. The results of an X-ray powder diffraction pattern of the product indicate that the $La_{1.8}Na_{0.2}CuO_z$ product has tetragonal symmetry with a $K_2NiF_4$-type structure. No other phase was detected. The d-spacings, the relative intensities and the indices of the observed reflections are shown in Table I.

Meissner effect measurements showed that the compound is a superconductor with a transition temperature, $T_c$, of about 15 K.

TABLE I

| d-spacing, A | Intensity | hkl |
|---|---|---|
| 3.619 | 18 | 101 |
| 3.300 | 10 | 004 |
| 2.858 | 100 | 103 |
| 2.660 | 66 | 110 |
| 2.201 | 15 | 006 |
| 2.161 | 27 | 105 |
| 2.0758 | 35 | 114 |
| 1.8879 | 47 | 200 |
| 1.6980 | 9 | 116 |
| 1.6865 | 18 | 107 |
| 1.6751 | 6 | 211 |
| 1.6502 | 6 | 008 |
| 1.6393 | 12 | 204 |
| 1.5752 | 60 | 213 |

Example 2

2.7694 g of $La_2O_3$, 0.1170 g of $Na_2O_2$ and 0.7955 g CuO were ground together in an agate mortar for 30 min. inside a dry box. The resulting powder was loaded in a gold tube ($\frac{3}{8}''$ dia and 5" length) and the tube was sealed by welding it. The tube was then heated to 850° C. for 12 hours in a furnace. The tube was cooled to 100° C. in the furnace, then removed from the furnace and quenched to room temperature. The tube was cut open and the black powder product was recovered. The X-ray powder diffraction pattern of the product is essentially the same as that shown in Table I and indicates that the $La_{1.7}Na_{0.3}CuO_z$ product is a single phase and has tetragonal symmetry with the $K_2NiF_4$-type structure.

Meissner effect measurements of the powder showed a superconducting phase transition of about 12 K.

Example 3

2.6065 g of $La_2O_3$, 0.1560 g of $Na_2O_2$ and 0.7955 g CuO were ground together in an agate mortar for 30 min. inside a dry box. The resulting powder was loaded in a gold tube ($\frac{3}{8}''$ dia and 5" length) and the tube was sealed by welding it. The tube was then heated to 850° C. for 12 hours in an autoclave. The tube was cooled in the autoclave to 100° C., then removed from the autoclave and quenched to room temperature. The tube was cut open and the black powder product was recovered. The results of an X-ray powder diffraction pattern of the product indicate that the product is a mixture of a tetragonal $K_2NiF_4$-type phase having essentially the same powder diffraction pattern as that shown in Table I and $NaCuO_2$.

Meissner effect measurements of the powder showed a superconducting phase transition of about 12 K.

Example 4

2.7694 g of $La_2O_3$, 0.1170 g of $Na_2O_2$ and 0.7955 g of CuO were ground together in an agate mortar for 30 min inside a dry box. The resulting powder was loaded in a gold tube ($\frac{3}{8}''$ dia and 5" length) and the tube was sealed by welding it. The tube was subjected to an external pressure of 3 kbar (100 MPa) and heated to 900° C. for 12 hours in an autoclave. The tube was cooled to 100° C. in the autoclave, then removed from the autoclave and quenched to room temperature. The tube was cut open and the black powder product was recovered. The X-ray powder diffraction pattern of the product is essentially the same as that shown in Table I and indicates that the $La_{1.7}Na_{0.3}CuO_z$ product is a single phase and has tetragonal symmetry with $K_2NiF_4$-type structure.

Meissner effect measurements showed the compound is a superconductor with a transition temperature, $T_c$, of about 30 K.

Example 5

2.4436 g of $La_2O_3$, 0.1950 g of $Na_2O_2$ and 0.7955 g if CuO were ground together in an agate mortar for 30 min inside a dry box. The resulting powder was loaded in a gold tube ($\frac{3}{8}''$ dia and 5" length) and the tube was sealed by welding it. The tube was subjected to an external pressure of 3 kbar (100 MPa) and heated to 900° C. for 12 hours in an autoclave. The tube was cooled to 100° C. in the autoclave, then removed from the autoclave and quenched to room temperature. The tube was cut open and the black powder product was recovered. The X-ray powder diffraction pattern of the product indicates that the product is a mixture of a tetragonal $K_2NiF_4$-type phase having essentially the same powder diffraction pattern as that shown in Table I and Na-$CuO_2$.

Meissner effect measurements of the powder showed a superconducting phase transition at about 30 K.

Example 6

2.6065 g of $La_2O_3$, 0.1560 g of $Na_2O_2$ and 0.7955 g CuO were ground together in an agate mortar for 30 min. inside a dry box. The resulting powder was loaded in a gold tube ($\frac{3}{8}$" dia and 5" length) and the tube was sealed by welding it. The tube was subjected to an external pressure of 3 kbar (100 MPa) and heated to 900° C. for 12 hours in an autoclave. The tube was cooled to 100° C. in the autoclave, then removed from the autoclave and quenched to room temperature. The tube was cut open and the black powder product was recovered. The X-ray powder diffraction pattern of the product indicates that the product is a mixture of a tetragonal $K_2NiF_4$-type phase having essentially the same powder diffraction pattern as that shown in Table I and $NaCuO_2$.

Meissner effect measurements of the powder showed a superconducting phase transition at about 30 K.

Example 7

2.9323 g of $La_2O_3$, 0.0780 g of $Na_2O_2$ and 0.7955 g CuO were ground together in an agate mortar for 30 min. inside a dry box. The resulting powder ws loaded in a gold tube ($\frac{3}{8}$" dia and 5" length) and the tube sealed by welding it. The tube was subjected to an external pressure of 3 kbar (100 MPa) and heated to 900° C. for 12 hours in an autoclave. The tube was cooled to 100° C. in the autoclave, then removed from the autoclave and quenched to room temperature. The tube was cut open and the black powder product was recovered. The X-ray powder diffraction pattern of the product is essentially the same as that shown in Table I and indicates that the $La_{1.8}Na_{0.2}CuO_z$ product in a single phase and has tetragonal symmetry with the $K_2NiF_4$-type structure.

Meissner effect showed the compound is a superconductor with a transition temperature of about 20 K.

The invention being claimed is:

1. A superconducting composition containing a metal oxide phase of the formula $La_{2-x}Na_xCuO_z$
   wherein x is a value from about 0.1 to about 0.3;
   z is a value from about 3.8 to about 4.2; and p1 said phase has the tetragonal $K_2NiF_4$-type structure with the I4/mmm space group as determined by X-ray powder diffraction measurements, said composition having a superconducting transition temperature above 10 K.

2. A superconducting composition as in claim 1 wherein z has a value of about 4.

3. A process for making a superconducting composition containing a metal oxide phase of the formula $La_{2-x}Na_xCuO_z$, wherein x is a value from about 0.1 to about 0.3, and z is a value from about 3.8 to about 4.2, said process consisting essentially of mixing stoichiometric quantities of $La_2O_3$, $Na_2O_2$ and Cu; heating said mixture in a sealed nonreactive metal container at about 850° C. to about 900° C. for about 12 to about 24 hours to form an oxide composition; furnace-cooling said composition to about 100° C.; and thereafter quenching said composition at ambient temperature.

4. A process as in claim 3 wherein said sealed container while being heated is subjected to an external pressure of about 3 kbar.

5. A method for conducting an electrical current within a conductor material without electrical resistive losses comprising the steps of:
   cooling a conductor material composed of a composition containing a metal oxide phase of the formula $La_{2-x}Na_xCuO_z$
   wherein x is a value from about 0.1 to about 0.3;
   z is a value from about 3.8 to about 4.2; and
   said phase has the tetragonal $K_2NiF_4$-type structure with the I4/mmm space group as determined by x-ray powder diffraction measurements, to a temperature below the superconducting transition temperature of the material;
   initiating a flow of electrical current within said conductor material while maintaining said material below the transition temperature at which said material becomes superconducting.

6. A method as in claim 5 wherein said conductor material is cooled to a temperature at or below about 10 K.

* * * * *